Figure 1:
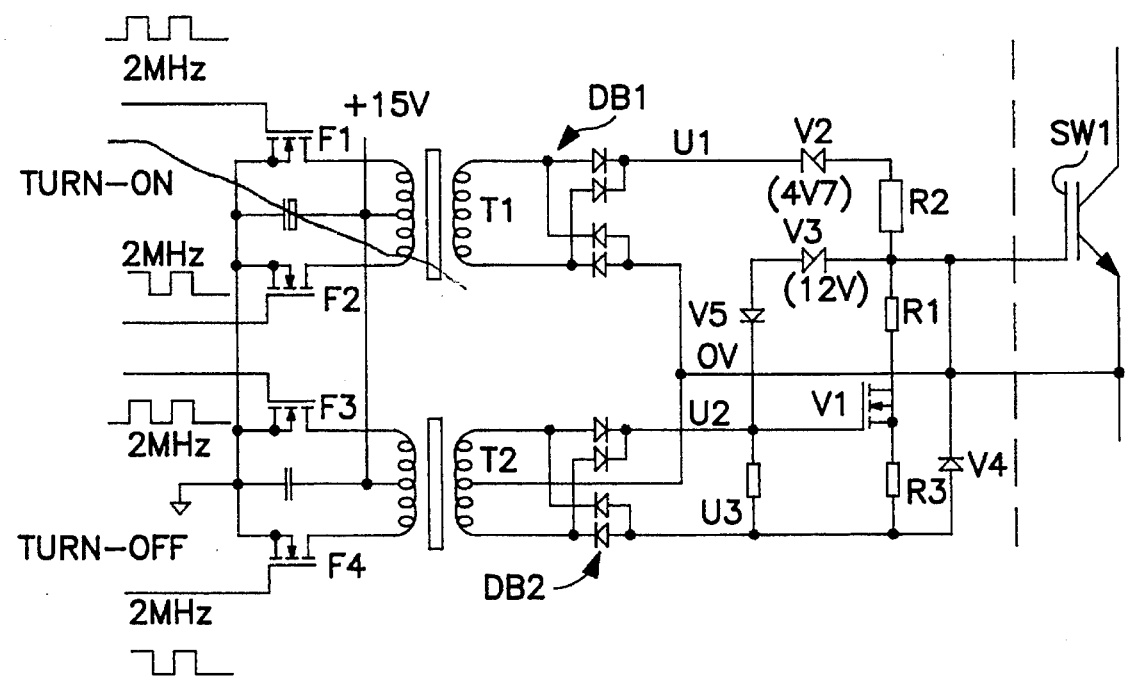

United States Patent [19]

Miettinen

[11] Patent Number: 5,530,385
[45] Date of Patent: Jun. 25, 1996

[54] CONTROL CIRCUIT FOR A SEMICONDUCTOR SWITCH

[75] Inventor: Erkki Miettinen, Helsinki, Finland

[73] Assignee: ABB Industry Oy, Helsinki, Finland

[21] Appl. No.: 520,470

[22] Filed: Aug. 28, 1995

[30] Foreign Application Priority Data

Sep. 27, 1994 [FI] Finland .................................. 944485

[51] Int. Cl.$^6$ .............................................. H03K 19/084
[52] U.S. Cl. ..................... 327/108; 327/303; 327/304; 327/584
[58] Field of Search ..................... 327/108, 584, 327/303, 304

[56] References Cited

U.S. PATENT DOCUMENTS

| 5,168,182 | 12/1992 | Salerno et al. ............... | 307/571 |
| 5,210,479 | 5/1993 | Kimura et al. ............... | 327/108 |

FOREIGN PATENT DOCUMENTS

| 0516316 | 9/1993 | European Pat. Off. . |
| 0578555 | 1/1994 | European Pat. Off. . |
| 4139997 | 7/1992 | Germany . |

*Primary Examiner*—Margaret R. Wambach
*Attorney, Agent, or Firm*—Watson Cole Stevens Davis

[57] ABSTRACT

The invention relates to a control circuit for a semiconductor switch, comprising a transformer coupling (T1, T2) for generating AC voltage signals including both control energy and control information, a rectification coupling (DB1, DB2) for rectifying the AC voltage signals generated by the transformer coupling (T1, T2) for generating DC voltage levels (U1, U2, U3) appropriate for turning on and turning off a semiconductor switch (SW1), a first resistor (R2) connected at its first end to a driving electrode of the semiconductor switch (SW1), a second resistor (R1) connected between the driving electrode and the emitter or source electrode of the semiconductor switch, and a booster semiconductor switch (V1) provided between the driving electrode of the semiconductor switch (SW1) and an DC voltage output (U3) generated by the rectification coupling and intended for turning off the semiconductor switch, the driving electrode of the booster semiconductor (V1) being connected to a DC voltage output (U2) generated by the rectification coupling and intended for controlling the booster semiconductor. The control circuit further comprises a zener diode (V2) connected between a second end of the first resistor (R2) and a DC output (U1) generated by the rectification coupling and intended for turning on the semiconductor switch (SW1) and a diode (V4) connected in a forward direction between the turn-off voltage output (U3) of the rectification coupling and the emitter or source electrode of the semiconductor switch (SW1).

4 Claims, 2 Drawing Sheets

CONTROL CIRCUIT FOR A SEMICONDUCTOR SWITCH

This invention relates to a control circuit for a semiconductor switch, comprising a transformer coupling for Generating AC voltage signals including both control energy and control information, a rectification coupling for rectifying the AC voltage signals generated by the transformer coupling for generating DC voltage levels appropriate for turning on and turning off the semiconductor switch, a first resistor connected at its first end to a driving electrode of the semiconductor switch, a second resistor connected between the driving electrode and the emitter or source electrode of the semiconductor switch, and a booster semiconductor switch provided between the driving electrode of the semiconductor switch and a DC voltage output generated by the rectification coupling and intended for turning off the semiconductor switch, the driving electrode of the booster semiconductor being connected to a DC voltage output generated by the rectification coupling and intended for controlling the booster semiconductor switch.

The control circuit of the invention is especially intended for controlling small IGBT or FET semiconductor switch components in frequency converters and other similar devices. In the following, these semiconductor switch components are Generally referred to as power components. Control circuits for controlling similar power components are previously known e-G- from U.S. Pat. No. 5,168,182 and European Patent Application 561316. The solutions described in them are also based on direct transmission of turn-on energy through a transformer. However, it is typical of both solutions that the voltage of the driving electrode, in the following referred to as a grid, of the power component to be controlled is not stabilized in case of a short circuit. In addition, it is typical of the solution known from U.S. Pat. No. 5,168,182 that a turn-off of the power component is based therein only on transferring the grid potential near the emitter potential of the power switch. In the solution described in European Patent Application 561316, negative potential compared with the emitter potential of the power component is used for a turn-off. To generate this negative potential, however, requires an energy storage, such as a capacitor, into which the required turn-off energy must be charged in advance. In addition, the capacitor used as the energy storage is a component the structure of which typically contains electrolyte and the life time of which is dramatically shortened if it is placed in a vicinity of a power component, and thus in a hot environment. Remote placing, in turn, may result in large stray inductance values. It can be further mentioned as a weakness of the control circuit in question that its turn-off voltage is equal in magnitude to its turn-on voltage, which results in slowing down of successive turn-on operations, since the grid potential of the power component must be charged to a negative value corresponding to the magnitude of the full turn-on voltage between successive turn-on operations. Another weakness of said circuit is a slow start of a turn-off, since a turn-off of a power component may be initiated only when the grid capacitance of a FET used as a booster semiconductor switch component is charged through a high-resistance resistor to a sufficiently high potential.

The object of the present invention is to provide a control circuit for a semiconductor switch having none of the above mentioned weaknesses of prior art control circuit solutions. This is achieved with a control circuit of the invention, which is characterized by further comprising a zener diode connected between a second end of the first resistor and a DC output generated by the rectification coupling and intended for turning on the semiconductor switch, and a diode connected in a forward direction between the turn-off voltage output of the rectification coupling and the emitter or source electrode of the semiconductor switch.

It must be stated that the diode and the zener diode do not refer herein only to discrete components called with the corresponding terms, but any component or set of components that actuates a corresponding function and is composed of discrete components or is a part of an integrated circuit.

Owing to the coupling used, turn-off energy may be constantly fed to the grid of the power component through the transformer coupling externally, and no energy storage is required, and no problems are thus caused by thermal aging of such energy storages either. Although there is no energy storage, a turn-off takes place rapidly owing to that the grid charge caused by a turn-on in the power component is discharged rapidly at the rate limited only by the impedance values of these components.

A control circuit preferably further comprises a serial connection of a zener diode and a diode in a forward direction between the driving electrode of the semiconductor switch and the driving electrode of the booster semiconductor switch. Owing to this coupling, excessive rise of the turn-on voltage, and thus the destruction of the semiconductor switch may be prevented in a situation of this kind.

The coupling preferably further comprises a third resistor connected between the booster semiconductor switch and the DC output intended for turning off the semiconductor switch. By means of a preferably low-resistance resistor of this kind, the peak value of the current generated by discharging of the grid voltage of the semiconductor switch may be limited to a certain desired value.

A basic principle of the control circuit of the invention is that there are several different DC voltage levels available. This is preferably achieved so that the transformer coupling used in the control circuit comprises a first transformer generating the voltage to be rectified to the turn-on voltage and a second transformer generating the voltages to be rectified to the turn-off voltage and the control voltage of the booster semiconductor switch, and that the second pole of the secondary winding of the first transformer and the midpoint of the secondary winding of the second transformer are connected to each other and to the emitter or source electrode of the semiconductor switch for forming a reference potential.

Figure 2:
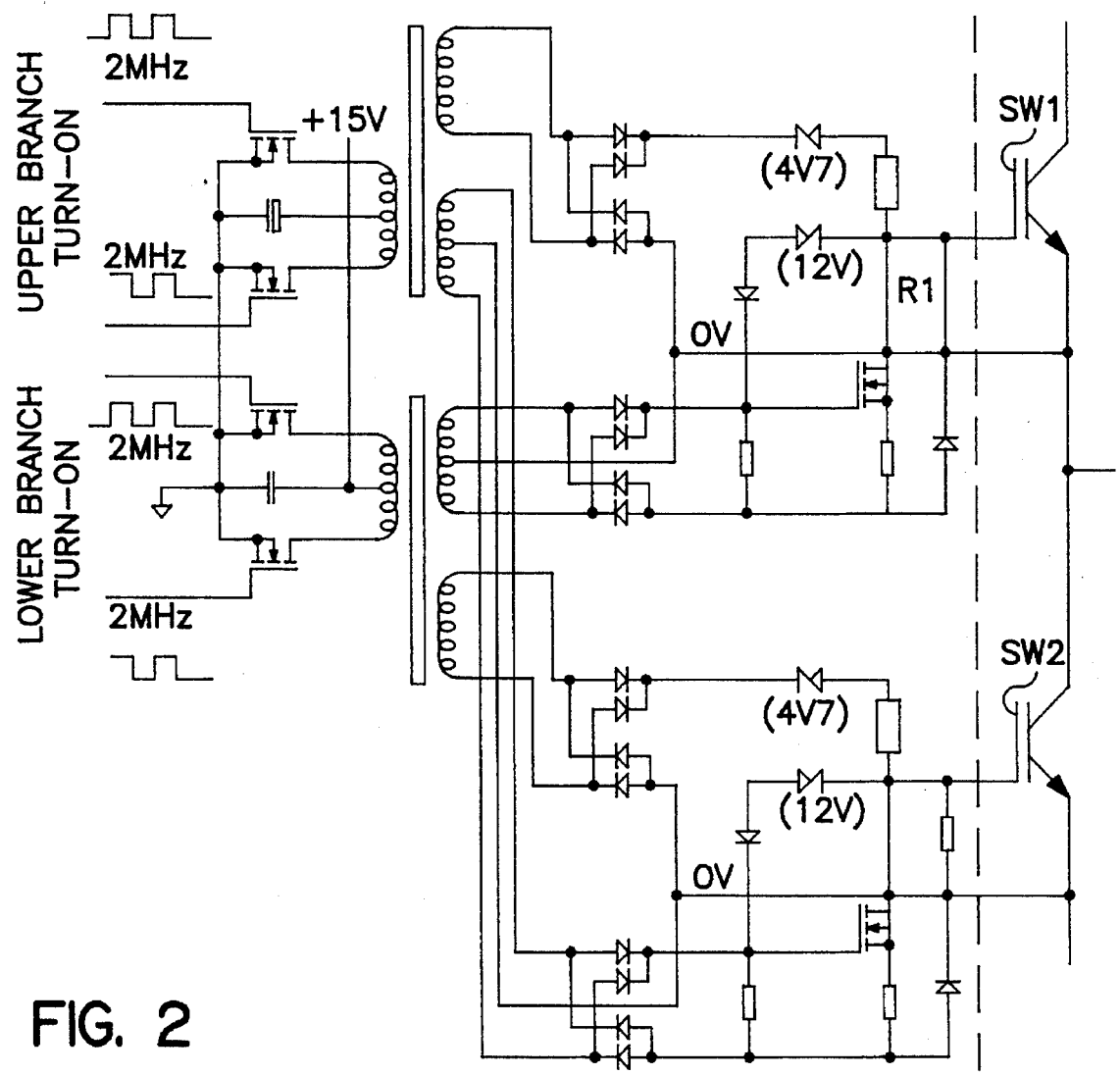

In the following, the control circuit of the invention is described in closer detail with reference to the attached drawing, in which FIG. 1 shows a circuit diagram of a control circuit of the invention, and FIG. 2 shows a circuit diagram of a control circuit of the invention having two semiconductor switches to be controlled, the switches being controlled alternately to a conducting state.

FIG. 1 shows a circuit diagram of an embodiment of a control circuit of the invention by way of example. This control circuit is used for controlling a power component SW1, which is typically an IGBT or a FET component, being an IGBT component in the case shown in the figure. The coupling is specifically suitable when the nominal current of the emitter-to-collector current path or the source collector current path of the power component does not exceed the value 25 A. The coupling shown in FIG. 1 comprises a transformer coupling that comprises transformers T1 and T2, the AC voltage signal levels generated by which are rectified by means of two rectifier bridges DB1 and DB2 to AC voltage levels suitable for controlling the power component SW1. By means of transformers T1 and T2, both control information and control energy are fed to the power component SW1.

The power component SW1 is turned on and off with two push-pull square waves (turn-on, turn-off), which, both cophasal and inverted, control the primary winding of transformer T1 and T2, respectively. The midpoints of the primary windings of the transformers are connected to a voltage of +15 V, and the free ends of the windings are alternatively connected to the ground potential by means of FETs F1. . . F4 controlled by the turn-on and the turn-off signal respectively. The secondary windings of the transformers generate signals corresponding to the control applied, and these signals are rectified on rectifier bridges DB1 and DB2 to voltages U1 and respectively U2 and U3. The voltage U1 is obtained from one pole of transformer T1, its other pole being connected to the reference potential, which is marked with 0 V. The midpoint of the secondary winding of the second transformer T2, as well as the emitter electrode of the power component SW1 are also connected to this reference potential. Voltage U2 is rectified from one pole of the second transformer T2, and voltage U3 from the other one. These voltages U2 and U3 are in the opposite direction compared with the reference potential 0 V at the midpoint of the secondary winding.

At the start of a turn-on, voltage U1 rises rapidly to the value of approximately 20 V, as a result of which the grid capacitance of the power component SW1 starts charging actuated by the current that passes through a zener diode V2 and the grid resistor R2. The value of the zener diode is marked as 4.7 V. The power component SW1 is turned on after about one microsecond, and the grid current starts to decrease and approaches zero. The driving electrode i.e. the grid of the power component SW1 is connected to voltage level U3 through the FET V1 used as the booster semiconductor switch component and resistor R3. In addition, the driving electrode of the power component SW1 is connected through a 12-V zener diode V3 and a diode V5 to voltage level U2, which, in turn, is connected to the driving electrode of the FET V1. Due to this coupling, such a situation is achieved that if the voltage on the grid of the power component SW1 exceeds the level of some 15 V, FET V1 goes to a conducting state as a result of which the current passing through it and the diode V4 connected between voltage level U3 and the reference voltage level 0 V limits the rise of the voltage further. For this reason, the grid voltage of the power component can not exceed said voltage of some 15 V. For the same reason, if the power component were short circuited, the rise of the grid voltage above the voltage in question would be prevented. In case of a short circuit, it is possible to eliminate the control of the turn-on first and turn off the power component "softly" by means of resistor R1, and switch on the rigid turn-off only later. Resistor R1 is connected between the grid and emitter electrodes of the power component.

At the start of a turn-off, the DC voltage level U2 on the grid of the FET V1 rises very rapidly to the level +5 V, as a result of which the FET V1 goes to a conducting state. Accordingly, the source voltage U3 of the FET V1 simultaneously tends downwards to the level −5 V, but the generated current initially raises the source voltage in question to a positive value corresponding to the value of the diode forward voltage of diode V4. The grid voltage of the power component SW1 is initially discharged only with the current limited by the internal resistance of the FET V1 through diode V4. The magnitude of this current is additionally limited with a low-resistance resistor R3 in the coupling shown in FIG. 1, the resistor being connected between the source electrode of the FET V1 and voltage level U3. After about 200 ns from the start of the turnoff, the grid voltage of the power component is in the emitter potential, and approaches and finally reaches the level −5 V, since the zener diode V2 prevents the current from passing through rectifier bridge DB1 and the secondary winding of transformer T1. Without the effect of the zener diode V2 the grid voltage would not achieve this negative level. Furthermore, saturation of the core of transformer T1 is prevented owing to the effect of direct current.

Resistor R1 connected between the grid of the power component SW1 and the emitter maintains the grid of the power component in the emitter potential and the component in off-state when neither boosting voltage nor control signals are available.

FIG. 2 shows a solution by means of which the control circuit described in FIG. 1 may be used for controlling a whole branch, i.e. in a situation in which the number of the power semiconductor components to be controlled is two, i.e. power components SW1 and SW2 are controlled alternately to a conducting state. The control circuits of both power components are similar to that shown in FIG. 1, and they operate in a way as set out previously, the transformer coupling and its controllers not being doubled, however. By means of the coupling shown in FIG. 2, two transformers and their controllers are saved compared with a doubled solution. This is achieved in that when one control signal turns on the power component of the upper branch, it simultaneously generates a voltage that turns off the power component of the lower branch. Similarly, the other transformer generates the voltage levels required for turning off one power component, and accordingly the voltage levels required for turning on the other power component. As a power component is turned off much faster than it is turned on in the control circuit of the invention, one power component may be turned off before the other power component controlled with the same control signal is turned on, which prevents a breakthrough of the branch. If both power components are momentarily controlled at the same time, both power components are turned off. This is based on that the grids of both booster semiconductor switch components go to a controlled state, and thus to a conducting state. In that case, the current passing them rises so high that the winding that feeds turn-on energy for the transformer cannot maintain the grid voltage of the power component, but it drops and the component turns off. The control may be removed simultaneously from both power components after a few dozens of microseconds. As a result of this, the power components remain in off-state as explained previously, owing to the effect of the resistor connected between the grid and the emitter of the components.

As stated above, in the control circuit of the invention, the energy required for turning on the power component is applied directly through the transformer from the primary circuit, and no energy storage is required in the emitter potential of the power component. Since neither electrolyte capacitors having a relatively low heat resistance nor other heat sensitive components are required in the solution of the invention, the control circuit of the invention may also be placed in a hot environment without shortening its lifetime.

It may be summarized that it is typical of the control circuit of the invention that due to the transformer coupling, a complete galvanic insulation up to an arbitrary voltage level may be carried out by means of the control circuit, no separate power feed is required to the grid control circuit, the power component is turned off with a negative grid voltage, a soft turn-off is possible in case of a short circuit, regulation of the turn-on voltage and limiting of the grid voltage take place automatically in case of a short circuit, and a turn-off takes place much faster than a turn-on, and due to dead time resulting from that, a push-pull connected power stage can not break through.

The control circuit for a semiconductor switch of the invention is described above by way of example by means of one embodiment only, and it is understandable that a few modifications may be made to it without deviating from the scope of the protection set forth in the attached claims. Thus, the IGBT component used as a power component in the description could be a FET component. Similarly, other electronic switch components than the FET shown in the figures are suited for use as a booster semiconductor switch.

I claim:

1. A control circuit for a semiconductor switch, comprising a transformer coupling for generating AC voltage signals including both control energy and control information, a rectification coupling for rectifying the AC voltage signals generated by the transformer coupling for generating DC voltage levels appropriate for turning on and turning off the semiconductor switch, a first resistor connected at its first end to a driving electrode of the semiconductor switch, a second resistor connected between the driving electrode and the emitter or source electrode of the semiconductor switch, and a booster semiconductor switch provided between the driving electrode of the semiconductor switch and a DC voltage output generated by the rectification coupling and intended for turning off the semiconductor switch, the driving electrode of the booster semiconductor being connected to a DC voltage output generated by the rectification coupling and intended for controlling the booster semiconductor switch, a zener diode connected between a second end of the first resistor and a DC output generated by the rectification coupling and intended for turning on the semiconductor switch, and a diode connected in a forward direction between the turn-off voltage output of the rectification coupling and the emitter or source electrode of the semiconductor switch.

2. A control circuit as claimed in claim 1, further comprising a serial connection of a zener diode and a diode in a forward direction between the driving electrode of the semiconductor switch and the driving electrode of the booster semiconductor switch.

3. A control circuit as claimed in claim 1, further comprising a third resistor connected between the booster semiconductor switch and the DC output intended for turning off the semiconductor switch.

4. A control circuit as claimed in claim 1, wherein the transformer coupling comprises a first transformer generating the voltage to be rectified to the turn-on voltage, and a second transformer generating the voltages to be rectified to the turn-off voltage and the control voltage of the booster semiconductor switch, and the second pole of the secondary winding of the first transformer and the midpoint of the secondary winding of the second transformer are connected to each other and to the emitter or source electrode of the semiconductor switch for forming reference potential.

* * * * *